United States Patent [19]

Nelson

[11] Patent Number: 4,974,782
[45] Date of Patent: * Dec. 4, 1990

[54] PRESSURE DEVELOPER AND ROLLS THEREFOR HAVING SEGMENTS OF ELASTOMERIC MATERIAL FOR CONTROL OF MODULUS OF ELASTICITY

[75] Inventor: Erik K. Nelson, Centerville, Ohio

[73] Assignee: The Mead Corporation, Dayton, Ohio

[*] Notice: The portion of the term of this patent subsequent to Sep. 5, 2006 has been disclaimed.

[21] Appl. No.: 440,834

[22] Filed: Nov. 24, 1989

[51] Int. Cl.$^5$ ............................................. B02C 1/08
[52] U.S. Cl. .................................. 241/227; 29/116.1; 29/124; 29/125; 29/130; 29/132; 100/162 B; 241/293; 355/27
[58] Field of Search ................. 29/124, 125, 130, 132, 29/116.1; 241/293, 227; 354/304; 355/27; 100/162 B

[56] References Cited

U.S. PATENT DOCUMENTS

| | | | |
|---|---|---|---|
| 1,837,925 | 12/1931 | Thompson | 29/130 |
| 3,750,246 | 8/1973 | Pessen | 29/130 |
| 3,812,782 | 5/1974 | Funahashi | 29/130 |
| 4,727,392 | 2/1988 | Stone et al. | 354/304 |
| 4,864,343 | 9/1989 | Nelson | 29/130 |

FOREIGN PATENT DOCUMENTS 1127996 12/1956 France ................................ 29/130

Primary Examiner—Howard N. Goldberg
Assistant Examiner—Irene Cuda
Attorney, Agent, or Firm—Biebel, French & Nauman

[57] ABSTRACT

A two roll pressure developer for a microencapsulated web or medial material includes rolls which have a support shaft through the center, a hollow annular shell, and load-bearing elastomer material between the shaft and the shell supporting the shell and controlling the deflection of the shaft under development loads. The elastomer material is formed as a plurality of discrete annular segments with inside diameters mounted on the shaft and outer diameters mounted in the shell. The segments are distributed along the length of the shaft so as to provide the roll with a variable modulus of elasticity which is highest at the axial center of the shaft and lower at the ends. In one embodiment, the segments are identical in width and are varied in pitch or axial spacing. In another embodiment, the segments are spaced at the same pitch but are varied in axial thickness. In a third embodiment, the segments are of equal size and spacing and are formed with a modulus of elasticity which is greatest at the axial center of the roll, and progressively lower toward the roll ends.

9 Claims, 2 Drawing Sheets

४,९७४,७८२

PRESSURE DEVELOPER AND ROLLS THEREFOR HAVING SEGMENTS OF ELASTOMERIC MATERIAL FOR CONTROL OF MODULUS OF ELASTICITY

BACKGROUND OF THE INVENTION

This invention relates generally to pressure rolls for pressure treating sheets, and more particularly to a developer and a roll therefor suitable for use with an imaging system utilizing imaging sheets having a surface coating of rupturable photosensitive microcapsules. The pressure roll may be used within an apparatus for rupturing the microcapsules on such imaging sheets to produce an image.

This invention is an improvement to the invention as described in my U.S. Pat. No. 4,864,343 issued Sept. 5, 1989 and incorporated herein by reference.

SUMMARY OF THE INVENTION

The present invention provides a roll-type pressure fixing and developing apparatus in which sheet material to be treated is passed through a high pressure nip defined by a pair of rolls. A frame mounts the first roll for pressure engagement with the second roll for defining the nip for applying a load to the first roll.

Each of the rolls includes a support shaft and a cylindrical roll body secured to the shaft. The body has a length and defines a center point on the body and first and second ends spaced equidistantly in opposite directions from the center point. The body has a modulus of elasticity which varies as the axial position of the material varies along the length of the body. The body includes a cylindrical shell, preferably a shell formed from a hardened metallic material. Segments of elastomeric material are distributed axially within the shell such that the modulus of elasticity of the roll varies from a minimum value at the first and second ends of the roll to a maximum value at the axial center of the roll. The distribution of the modulus of elasticity is controlled by providing discrete annular blocks or segments of elastomer material positioned axially on the roll within the shell. Each segment may have the same inside and outside diameter, and the spacing, the axial thickness or the modulus of elasticity of the individual segments are controlled or varied to provide the desired distribution of the modulus.

Three embodiments are disclosed, In one, the individual segments are of variable width and constant pitch. In another the segments are of variable pitch and constant width. In a third, the segments are of constant pitch and width, and each segment is made of material or materials having a different modulus of elasticity or a different hardness. In all embodiments, the annular segments have common inside and outside diameters, to simplify the calculations and manufacture of the rolls.

As a result of these constructions, and as a load is applied to the rolls at the ends of their respective shafts, each shaft will bend such that the shafts are more closely spaced at their ends than at the roll centers. The elastomer material, rather than bending with the shafts as in conventional rolls, is compressed by the shaft load to an extent which is determined by the overall modulus of the body material. The segments are compressed most at the roll end, and the force applied to the nip along these portions of the roll is equal to the center portion of the roll where the modulus is at a maximum value. By selecting the distribution or the modulus of the segments, the overall modulus along the roll length, the force applied along the nip can be made uniform or, if desired, nonuniform in a predetermined fashion.

The bodies or segments of elastomer material may be any material within which the modulus of elasticity can be controlled, and may be formed from graphite filaments woven having a predetermined wrap angle, or from other suitable elastomer support material.

It is accordingly an important object of the invention to provide a cylindrical pressure roll for a pressure developer in which the modulus of elasticity of the roll is controlled by providing a plurality of discrete elastomer segments between a supporting shaft and an annular shell.

Another object of the invention is the provision of a developer roll, as outlined above, in which the bending moment of a supporting shaft is transferred to a shell through a plurality of individual segments of elastomeric, load-bearing material, in which the distribution of the mass and/or spacing of the segments or the modulus of the segments provides a desired distribution of the bending modulus of the roll.

A more particular object of the invention is to provide pressure rolls in which the modulus of elasticity of the supporting material between a support shaft and a shell varies from a minimum at the ends thereof to a maximum at the center thereof such as by a distribution of individual segments of such elastomer supporting material in the annulus or space between the roll and the shell or by a variation in the modulus of the segments.

These and other objects and advantages of the invention will be apparent from the following description, the accompanying drawings, and the appended claims.

DETAILED DESCRIPTION OF THE PREFERRED EMBODIMENTS

Figure 1:
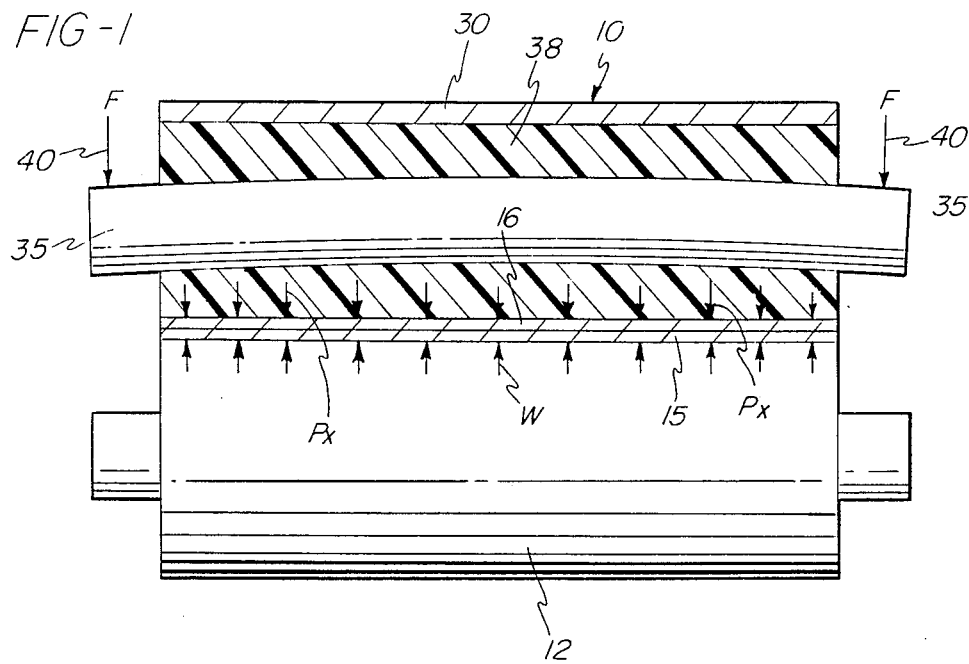
FIG. 1 represents a pair of pressure rolls made in accordance with U.S. Pat. No. 4,864,343.

Referring now to the drawings, FIG. 1 illustrates the two-roll pressure type developer of my U.S. Pat. No. 4,864,343 and includes a first roll 10 and a second roll 12 mounted in parallel to each other to define a nip 16 for receiving sheet material therebetween. The sheet material preferably consists of a donor sheet and a receiver sheet (not shown) made in accordance of the teachings of U.S. Pat. No. 4,399,209.

Due to the high linear unit forces involved in the development, it is important that roll-type developer operate without differential slippage at the nip which could tend to cause the web to wrinkle. It is also important that the pressure be developed uniformly throughout a working zone of the nip. Otherwise, the capsules may not rupture uniformly, producing nonuniform quality in the finished image.

The roll 10 of FIG. 1 includes a cylindrical outer shell 30 formed from a hardened material such as stainless steel. A loading shaft 35 extends through the roll 10. The main body portion of the roll between outer shell 30 and shaft 35 is comprised by a body of elastomer material 38. Loading F is applied as indicated by arrows 40.

The objective is to have a flexible medium transform the end load F into a uniformly applied continuous load on the shell 30 interior surface. This is achieved in my U.S. Pat. No. 4,864,343. A composite material 38 in which the compressibility or elastic modulus of the material varies along the length of the roll from the axial center of the roll. An example is given of a composite woven graphite fiber with a variable wrap angle. The desired variable modulus is achieved by varying the wrap angle along the length of the roll.

In the embodiments of the present invention, compensation for shaft bending is achieved by providing a series of individual annular rings or segments formed of an elastomer material. The segments may be formed either as a solid material or as a composite as described above. The segments are distributed symmetrically on either side of the axial center of the shaft 35, and have common inside and outside diameters which are joined or bonded respectively to the shaft 35 and to the opposed inside surface of the shell 30.

Figure 2:
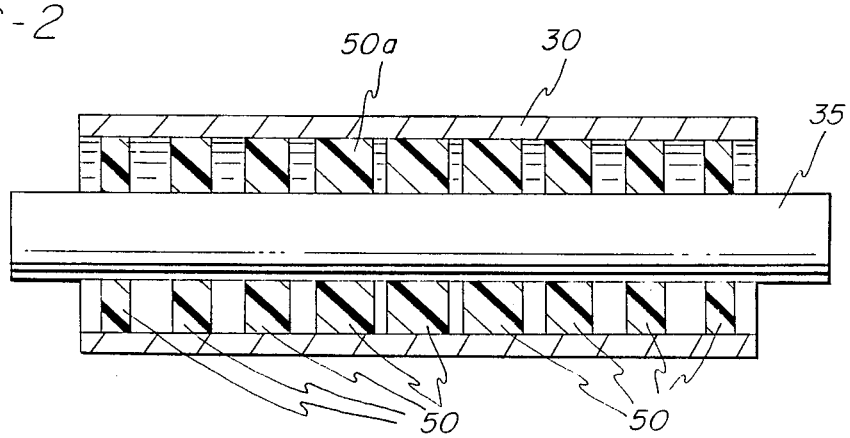
FIG. 2 is a section through one embodiment of a pressure roll in accordance with this invention.

Compensation for bending of the shaft 35 is achieved, in the embodiment of FIG. 2, by employing rings or segments 50 of identical material, and by varying the axial width W of the individual segments 50. The widest segment 50a is located at the shaft axial center, and the segments 50 on either side of the center segment 50 becoming progressively more narrow in width with increasing distance from the segment 50a. An equal number of such segments 50 are positioned on either side of the shaft center. However, in the embodiment of FIG. 2, the segments are distributed at a common pitch L, that is the centerline through each segment is spaced equally from the centerlines of the other segments.

Since all of the segments 50 may be formed of the same material, and since the segments in any given roll have the same inside and outside diameters, the design and construction is simplified over arrangements where the characteristic of the material, the space in which the material operates, or the overall shape of the material is progressively changed for compensation. Therefore, the embodiment of FIG. 2 can be made to work for any loading on the shaft.

Figure 3:
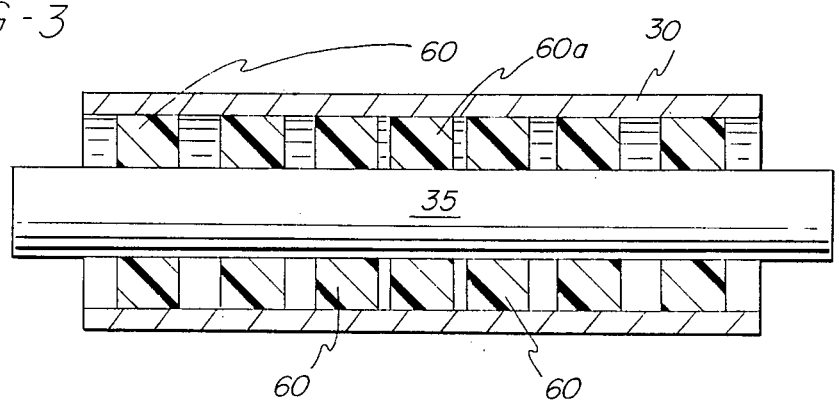
FIG. 3 is a section through a second embodiment of a pressure roll in accordance with this invention.

The embodiment of FIG. 3 differs from that of FIG. 2 in that the elastomeric segments 60 are of identical axial widths W, but the pitch L or spacing between segments is varied so that the segments 60 are closest together at the axial center of the roll and are progressively spaced further apart from the center, with increasing spacing from the center. Again, it is preferred to locate a segment 60a on the roll center, with an equal number of identical segments 60 located on either side of the center segment.

Figure 4:
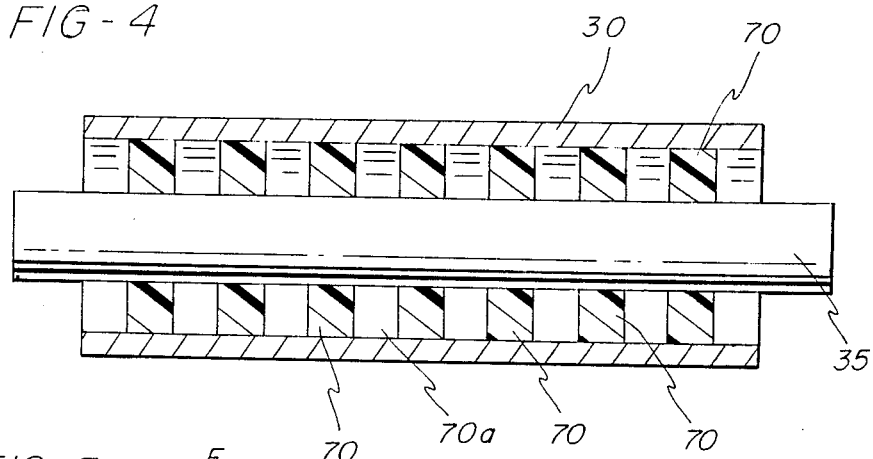
FIG. 4 is a section showing a third embodiment of the invention.
Figure 5:
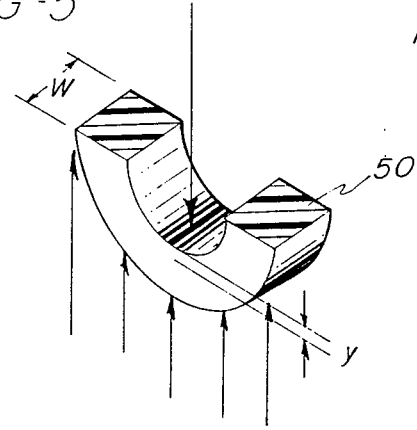
FIG. 5 is a diagram illustrating the forces on one-half of a segment and the deflection resulting from such forces.

In a further embodiment of the invention, as illustrated in the sectional view of FIG. 4, the individual segments 70 of elastomeric material, bonded or joined between the shaft 35 and the inside surface of the shell 30, are of equal spacing or pitch L and equal width W. Compensation for bending is provided by the fact that the segments 70, spaced on either side of a central segment 70a have a decreasing modulus of elasticity with an increasing distance from the center. Thus, the modulus of elasticity of the center segment 70a will have a maximum value, as compared to the decreasing modulus of each of the additional segments 70 with increasing distance from the center segment 70a.

Figure 6:
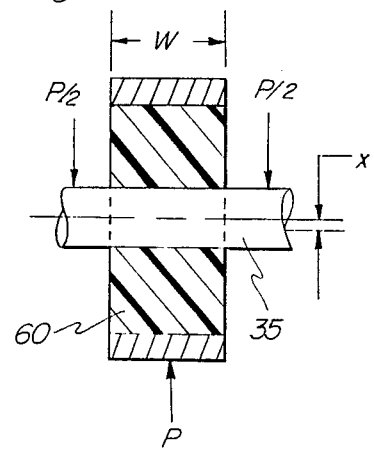
FIG. 6 is another diagram illustrating a fragment of the roll which includes one of the elastic segments.

One approach to the implementation of this invention is to consider an annular segment of elastomer material loaded as in FIG. 6. The load versus deflection characteristics approximate a straight line function. For the straight line portion of the deflection, $P=KY$. The spring constant $S$ is related to the Young's Modulus E of the material, inside and outside diameters of the segment and segment width. Since the segment diameters are fixed, we can write: $K =$ a function of the diameter $\times E \times W$ or $K = \phi \times E \times W$ where $\phi$ is a constant. Hence:

$$P = \phi \times E \times W \times Y \qquad (A)$$

The three cases are to be analyzed as follows:

(1.) Rings or segments 50 of variable width, constant pitch, constant E. (FIG. 2.)

For this case, P=constant, and equation (A) reduces to $W_c y_c = W_i (y_c + y_i)$, or $$W_i = \frac{W_c y_c}{y_c + y_i}$$

where $W_c + y_c$ are width and deflection of the center element. $y_i$=incremental deflection of shaft due to bending at any ring location i. $W_i$=width of element i.

Figure 7:
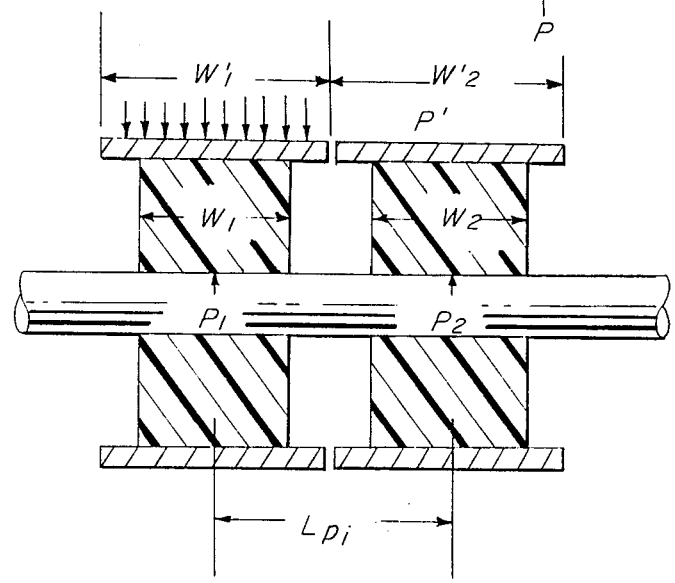
FIG. 7 is a further diagram for assisting in the explanation of the forces as they relate to the spacing of the segments.

2. Segments 60 of constant width, constant E, but pitch L is varied to compensate for the shaft bending (FIG. 3). From equation (A), it follows that $\phi$, E and W are constant and P/y=constant. In other words, the total load carried by the element is proportional to the deflection referring to FIG. 7:

$$\frac{P_c}{y_c} = \frac{P_i}{y_c + y_i} \text{ or } P_i = P_c \times \frac{y_c + y_i}{y_c}$$

where $P_c$=load carried by center element, $P_i$=load carried by element i. The load $P = p \times W$ for any element where p=Load/in. Pitch length is then:

$$l_{pi} = \frac{W_i + W_{i+1}}{2} \frac{P_i + P_{i+1}}{2P} =$$

$$\frac{P_c}{2Py_c} [(y_c + y_i) + y_c + y_{c+1})]$$

$$l_{pi} = \frac{P_c}{2Py_c} [2 y_c + y_i + y_{i+1}]$$

3. For the third embodiment for the segments 70 (FIG. 4), the material stiffness (Young's Modulus) is changing at each element. Assume:

$W_i$, $\phi$, P=constant, then $E_i$ $Y_i$=constant, $E_c Y_c = (Y_c + Y_i) E_i$, or $$E_i = E_c \times \frac{Y_c}{Y_c + Y_i}$$

While the forms of apparatus herein described constitute preferred embodiments of this invention, it is to be understood that the invention is not limited to these precise forms of apparatus, and that changes may be made therein without departing from the scope of the invention which is defined in the appended claims.

What is claimed is:

1. An improved pressure roll, particularly adapted for use as one of the rolls in a two-roll pressure developer, comprising:

a support shaft, an annular shell about said shaft, a plurality of annular elastomeric segments positioned in axially spaced relation along said shaft between said shaft and said shell, said segments having inside diameters mounted on said shaft and outside diameters supported on said shell, said segments arranged along said shaft with a single said segment at the axial center of said roll and an equal number of said segments positioned on either side of said single segment, each of said segments being of equal axial width and equal spacing from each other, the modulus of elasticity of each of said segments varying from a maximum at said segment and progressively decreasing with increasing distance in spacing of said segments from said center segment.

2. A two roll pressure developer for microcapsule media web or paper material in which each roll has a support shaft, a hollow annular shell, and load-bearing elastomer material between the shaft and the shell supporting the shell on the shaft and providing for controlled deflection of the shaft under development loads, the improvement for providing a uniform pressure along a nip between said rolls, comprising said elastomer material being formed as a plurality of discrete annular spaced apart segments having inner diameters mounted on the shaft and outer diameters mounted in the shell, said segments being distributed along the length of said shaft in accordance with a predetermined progression to provide said roll with a variable modulus of elasticity which is highest at the axial center of said roll and least at the ends thereof.

3. The developer of claim 2 in which said segments are each identical in axial width and are spaced on said shaft farther apart on the shaft ends than at the shaft axial center.

4. The developer of claim 2 in which said segments vary in axial width, with the segments adjacent the ends of said roll being narrower in axial width than the segments closer to the axial center of said roll.

5. The developer of claim 4 in which said segments are distributed along said shaft along common pitch lines.

6. A pressure roll adapted for use with another roll to form a two-roll nip-forming press for the pressure development of microencapsulated imaging sheet-type materials including an outer cylinder-shaped shell and central supporting shaft extending through said shell and defining an open annular space therebetween, the improvement in a variable modulus support in said annular space so that said shell is supported by said shaft and maintained straight with a uniform pressure along a pressure nip with a second said roll;

a plurality of annular elastomeric segments positioned in axially spaced relation to each other along said shaft and in said annular space between said shaft and said shell, said segments each having inside diameters mounted on said shaft and outside diameters supporting said shell, said segments providing for a variable modulus of elasticity between said shell and said shaft which is greater at the axial center of said roll and decreases to a minimum at the ends of said roll.

7. The pressure roll of claim 6 in which said segments are each formed of the same material, are essentially identical to each other in size, and are spaced from the axial center of the roll by a pitch which increases with increasing distance from such roll center.

8. The pressure roll of claim 6 in which said segments are each formed of the same material and are spaced from the axial center of said roll at a uniform pitch, and are progressively more narrow in axial width with increasing distance from such roll center.

9. The pressure roll of claim 6 in which said segments are each of equal size and equal spacing on said shaft and in which the modulus of elasticity of each segment decreases from a maximum at the axial center of said shaft to a minimum at the ends thereof.

* * * * *

UNITED STATES PATENT AND TRADEMARK OFFICE
CERTIFICATE OF CORRECTION

PATENT NO. : 4,974,782
DATED : Dec. 4, 1990
INVENTOR(S) : Erik K. Nelson

It is certified that error appears in the above-identified patent and that said Letters Patent is hereby corrected as shown below:

Col. 5, line 24, before "segment" insert -- center --.

Col. 6, line 14, before "central" insert -- a --.

Signed and Sealed this

Twenty-eighth Day of April, 1992

Attest:

HARRY F. MANBECK, JR.

*Attesting Officer*   *Commissioner of Patents and Trademarks*